United States Patent
Siu et al.

(10) Patent No.: US 10,984,691 B2
(45) Date of Patent: Apr. 20, 2021

(54) PANEL DEFECT DETECTION METHOD AND A DISPLAY DRIVER APPARATUS INCORPORATING THE SAME

(71) Applicant: Solomon Systech (Shenzhen) Limited, Shenzhen (CN)

(72) Inventors: Choi Wing Siu, Hong Kong (HK); Wing Chun Chan, Hong Kong (HK); Ho Ming Chan, Hong Kong (HK); Haojuan Dai, Shenzhen (CN); Wei Gong, Shenzhen (CN)

(73) Assignee: Solomon Systech (Shenzhen) Limited, Shenzhen (CN)

( * ) Notice: Subject to any disclaimer, the term of this patent is extended or adjusted under 35 U.S.C. 154(b) by 348 days.

(21) Appl. No.: 16/008,472

(22) Filed: Jun. 14, 2018

(65) Prior Publication Data
US 2019/0304350 A1     Oct. 3, 2019

Related U.S. Application Data

(60) Provisional application No. 62/649,617, filed on Mar. 29, 2018.

(51) Int. Cl.
*G09G 3/00* (2006.01)
*G01R 31/28* (2006.01)
*G09G 3/34* (2006.01)

(52) U.S. Cl.
CPC ......... *G09G 3/006* (2013.01); *G01R 31/2825* (2013.01); *G09G 3/344* (2013.01); *G09G 2310/0267* (2013.01); *G09G 2330/12* (2013.01)

(58) Field of Classification Search
CPC .............. G09G 3/006; G09G 3/344; G09G 2310/0267; G09G 2330/12; G01R 31/2825
USPC ........................................................ 324/511
See application file for complete search history.

(56) References Cited

U.S. PATENT DOCUMENTS

| | | | |
|---|---|---|---|
| 2009/0284278 A1* | 11/2009 | Hata | G09G 3/006 324/750.3 |
| 2012/0056857 A1* | 3/2012 | Li | G09G 3/20 345/204 |
| 2013/0187898 A1 | 7/2013 | Lee et al. | |
| 2013/0300439 A1* | 11/2013 | Mignard | G01F 27/2605 324/679 |
| 2014/0028660 A1* | 1/2014 | Fujimori | G09G 3/344 345/214 |
| 2015/0198641 A1* | 7/2015 | Moon | G09G 3/006 324/537 |
| 2016/0027381 A1* | 1/2016 | Ryu | G09G 3/3233 345/76 |
| 2016/0351095 A1* | 12/2016 | Tani | G09G 3/3283 |
| 2016/0377897 A1* | 12/2016 | Kimura | H01L 27/1225 349/46 |
| 2017/0139303 A1* | 5/2017 | Amundson | G02F 1/13306 |

(Continued)

*Primary Examiner* — Steven L Yeninas
(74) *Attorney, Agent, or Firm* — Spruson & Ferguson (Hong Kong) Limited

(57) ABSTRACT

A method and a display driver apparatus for detecting panel defect on an electronic paper display (EPD) are provided. A sense voltage from the voltage for common (VCOM) electrode of the EPD is obtained and compared with an upper reference voltage and a lower reference voltage. As the sense voltage is proportional to a total capacitance of the plural display electrode capacitors on the EPD, a defective panel with capacitance abnormality or opened circuits can be identified.

17 Claims, 16 Drawing Sheets

(56) References Cited

U.S. PATENT DOCUMENTS

| | | | |
|---|---|---|---|
| 2018/0350285 A1* | 12/2018 | Goto | G09G 3/20 |
| 2019/0123072 A1* | 4/2019 | Li | G02F 1/136213 |
| 2019/0251911 A1* | 8/2019 | Ho | G02F 1/1345 |
| 2019/0272786 A1* | 9/2019 | Chaji | G09G 3/3225 |

\* cited by examiner

PANEL DEFECT DETECTION METHOD AND A DISPLAY DRIVER APPARATUS INCORPORATING THE SAME

CROSS-REFERENCE TO RELATED APPLICATIONS

This application claims the benefit of U.S. Provisional Patent Application No. 62/649,617, filed on Mar. 29, 2018, which is incorporated by reference herein in its entirety.

FIELD OF THE INVENTION

The present invention generally relates to method for detecting panel defect on a flat panel display and a display driver apparatus incorporating the same. In particular, the present invention relates to a defect detection method for an Electronic Paper Display.

BACKGROUND

There is a demand for liquid crystal displays that mimic traditional paper by displaying text information and images for weeks without electricity and without a constant refresh of the content. This can minimize the energy consumption of the display when the content is static. To meet this demand, the development of technologies associated with a non-volatile type display such as Electronic Paper Display (EPD) has been proposed and commercialized in various applications. In particular, the applications of electronic shelf labels (ESL) in retail shops and digital signage have widely utilized this technology for displaying information that is not changing frequently. For example, the EPD used as an ESL for displaying the product name, price, or promotional discount can save the manpower required for managing the price tag and centralize the update of the content with higher efficiency.

In view of the bi-stable nature of the EPD where the display image can be hold without power, a damaged EPD may not be recognized visually from the display. Even if some of the cells in the EPD have current leakages or opened circuits, those cells may not be noticeable merely by viewing the display as the content is retained from the last screen update and those cells are still displaying information. They may only be identified when renewing the content as those damaged cells cannot be renewed.

A technical approach for ascertaining whether the display is damaged is to dispose a conductive wire around or inside the display area connecting to a control unit. The control unit transmits a detection signal to the conductive wire, and the display is ascertained as damaged if the detection signal is not returned. However, this method apparently has the drawback of limiting the detection along the perimeter only as the detection heavily relied on the conductive wire. Furthermore, the detection scheme is designed for a major panel break and may not identify panel abnormality, panel aging and panel manufacturing error.

Accordingly, there is a need in the art to have an improved panel defect detection method for an EPD that overcomes, or at least ameliorates, one or more of the disadvantages described above. Furthermore, other desirable features and characteristics will become apparent from the subsequent detailed description and the appended claims, taken in conjunction with the accompanying drawings and this background of the disclosure.

SUMMARY OF THE INVENTION

A first aspect of the present disclosure provides a novel method for detecting panel defect on a non-volatile type display panel. The display panel comprises plural pixel cells. Each of the pixel cells has a thin film transistor (TFT), a display electrode capacitor, a gate line coupled to a gate electrode of the TFT, a source line coupled to a drain electrode of the TFT, a source electrode of the TFT coupled to one end of the display electrode capacitor, and a voltage for common (VCOM) electrode coupled to another end of the display electrode capacitor. The method comprises the following steps: (1) electrically connecting the VCOM electrode of the display panel to the sensing circuit for coupling a sense voltage to the sensing circuit, wherein the sense voltage is proportional to a total capacitance of the plural display electrode capacitors on the plural pixel cells of the display panel; and the sensing circuit is configured to generate a sense output from the sense voltage; (2) comparing the sense output with an upper reference voltage and a lower reference voltage; and (3) determining, by a diagnostic unit, a condition of the display panel, wherein the condition is normal if the sense output is bounded by the upper reference voltage and the lower reference voltage; and the condition is defective if the sense output is not bounded by the upper reference voltage and the lower reference voltage.

The second step of comparing the sense output with the upper reference voltage and the lower reference voltage may further comprise the following steps: (1) coupling the sense output to an inverted input of a first differential amplifier and coupling the upper reference voltage to a non-inverted input of the first differential amplifier; (2) coupling the sense output to a non-inverted input of a second differential amplifier and coupling the lower reference voltage to an inverted input of the second differential amplifier; and (3) coupling an output of the first differential amplifier to one input of an AND gate and coupling an output of the second differential amplifier to another input of the AND gate.

In accordance with certain embodiments of the present disclosure, the sense voltage is obtained by discharging the VCOM electrode gradually by the plural display electrode capacitors of the plural pixel cells.

In accordance with certain embodiments of the present disclosure, the upper reference voltage and the lower reference voltage are determined by a reference generator based on the total capacitance of the plural display electrode capacitors on the plural pixel cells of the display panel.

In accordance with certain embodiments of the present disclosure, the sense output is generated from the sense voltage using an analog-to-digital converter.

In accordance with certain embodiments of the present disclosure, the method further comprises the following steps: (1) coupling a VSS level to the source lines of each of the pixel cells; and (2) coupling a pulse of VGH level to each of the gate lines, such that the TFTs on each row of the pixel cells are enabled for a pre-determined duration. The TFTs on each row of the pixel cells are enabled in a sequential and interleaving manner by generating plural pulses of VGH level for the gate lines, wherein each pulse is not overlapped with other pulses.

In accordance with certain embodiments of the present disclosure, the method further comprises the following steps: (1) coupling a VSS level to the source lines of each of the pixel cells; and (2) coupling a VGH level to the gate lines of each of the pixel cells; such that all the TFTs are enabled when performing the VCOM sensing.

Another aspect of the present disclosure provides a method for detecting panel defect on a non-volatile type display panel. The method comprises the following steps: (1) coupling a VSH level to the VCOM electrode; (2)

coupling a pulse of VGH level to each of the gate lines, such that the TFTs on each row of the pixel cells are enabled for a pre-determined duration; (3) electrically connecting the source lines of the display panel to an external stabilizing capacitor and the sensing circuit for coupling a sense voltage to the sensing circuit, wherein the sense voltage is proportional to a total capacitance of the plural display electrode capacitors on the plural pixel cells of the display panel; and the sensing circuit is configured to generate a sense output from the sense voltage; (4) comparing the sense output with an upper reference voltage and a lower reference voltage; and (5) determining, by a diagnostic unit, a condition of the display panel, wherein the condition is normal if the sense output is bounded by the upper reference voltage and the lower reference voltage; and the condition is defective if the sense output is not bounded by the upper reference voltage and the lower reference voltage.

The details of one or more implementations of the present disclosure are set forth in the accompanying drawings and the following detailed description. Other features, structures, characteristics, and advantages of present disclosure will be apparent from the description and drawings, and from the claims.

BRIEF DESCRIPTION OF THE DRAWINGS

The appended drawings, where like reference numerals refer to identical or functionally similar elements, contain figures of certain embodiments to further illustrate and clarify various aspects, advantages and features of the present invention disclosed herein. It will be appreciated that these drawings depict only certain embodiments of the invention and are not intended to limit its scope. The method and the apparatus disclosed herein will be described and explained with additional specificity and detail through the use of the accompanying drawings in which.

Skilled artisans will appreciate that elements in the figures are illustrated for simplicity and clarity and have not necessarily been depicted to scale.

DETAILED DESCRIPTION

The following detailed description, the system and the corresponding apparatus are merely exemplary in nature and is not intended to limit the disclosure or its application and/or uses. It should be appreciated that a vast number of variations exist. The detailed description will enable those of ordinary skilled in the art to implement an exemplary embodiment of the present disclosure without undue experimentation, and it is understood that various changes or modifications may be made in the function and method described in the exemplary embodiment without departing from the scope of the present disclosure as set forth in the appended claims.

The present disclosure relates to a method for detecting panel defect on any non-volatile type display panels with configurable pixels, particularly on an electronic paper display (EPD). The preferred application of the present disclosure is for ascertaining the panel condition of an electronic shelf label (ESL). The terminology used herein is for the purpose of describing particular embodiments only and is not intended to be limiting of the described technology. As used herein, the terms "panel" and "display panel" are used interchangeably to refer to an EPD or other non-volatile type display panels, and may also be employed in other applications including volatile type display panels, whereby the panel can be a liquid crystal display (LCD), an organic light emitting diode (OLED) display, a plasma panel display (PDP), a field emission display (FED), an electrophoretic display, flexible display or other display devices comprised of a plurality of pixels that are capable of displaying images and/or video.

The terms "gate electrode", "source electrode", and "drain electrode", as used herein, collectively define the three terminals of a thin film transistor (TFT) in each pixel cell, having an active channel region controllable by the gate electrode for electrically connecting the source electrode and the drain electrode.

The term "gate lines" as used herein refers to the row-bus lines connected to an EPD for driving the gate electrodes of the TFT of the pixel cells. The term "source lines" as used herein refers to column-bus lines connected to an EPD for providing data to the pixel cells. Generally, a gate driving circuit is configured to generate gate control signals (with the abbreviation Gate[n−1:0]) coupled to the gate lines, whereas a source driving circuit is configured to generate source control signals (with the abbreviation Source[m−1:0]) coupled to the source lines.

Figure 1:
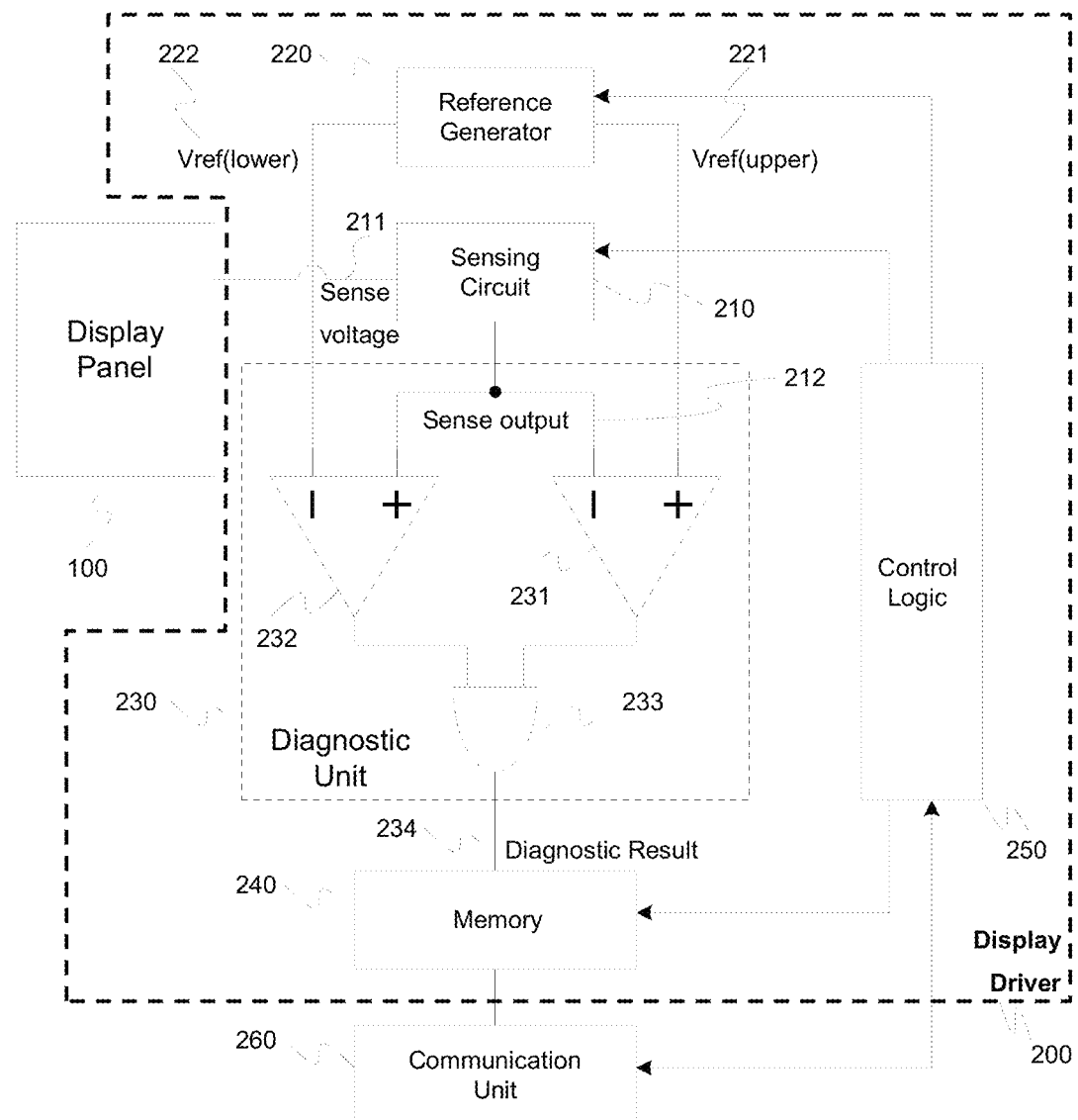
FIG. 1 depicts a block diagram showing, in outline, the overall structure of a display apparatus incorporating a panel defect detector for detecting panel defect on a panel according to one embodiment of the present disclosure.

FIG. 1 is a block diagram of a display apparatus incorporating a panel defect detector for detecting panel defect on a display panel 100. The display panel 100 according to one embodiment of the present disclosure is a non-volatile type display comprising plural pixel cells arranged in rows and columns. Preferably, the display panel 100 is an EPD which can display image without power, offering significant power savings over all other alternative display technologies. With the bi-stable characteristics of an EPD, a defective panel cannot be recognized visually from the display easily. Even if some of the pixel cells in the EPD have current leakages or opened circuits, those defective pixel cells may not be noticeable visually as the content therein can be retained from the last screen update. They may only be identified when failing to renew the content of those defective pixel cells. With the present disclosure, the problem in ascertaining the condition of the EPD is addressed. When performing panel defect detection, either by self-diagnostic or initiated by operator, the signals in the display panel 100 is sensed by electronic circuits, preferably incorporated within a display driver 200, for determining the condition of the display panel 100. The display driver 200 may also include other circuit blocks for receiving and processing image or video data for display purposes. In one embodiment, the display driver 200 or any part therein may be encompassed within a microcontroller (MCU), a custom integrated circuit, a field-programmable gate array (FPGA), gate in panel (GIP) circuits, a computer programmed to perform a method, a programmable I/O device, other semiconductor devices, or a combination of any aforesaid device. The circuits of the display driver 200 can be formed at least partially by logic gates, analog circuit blocks, transistors, semiconductor devices, discrete components, other electronic devices, or a combination of any aforesaid circuit structures. The display driver 200 comprises a sensing circuit 210, a reference generator 220, a diagnostic unit 230, a memory 240, and a control logic 250. Other circuit blocks for driving and updating the display panel 100 may also be included in the display driver 200, which are not shown in FIG. 1.

The sensing circuit 210 is configured to receive a sense voltage 211 from the display panel 100, and provide a sense output 212 to the diagnostic unit 230 for determining the condition of the display panel 100. Generally, the sense voltage 211 is an analog voltage level from the display panel 100 at the source line 121, or at the voltage for common (VCOM) electrode 110, which can reflect the condition of the display panel 100. The sense output 212 is a scaled analog voltage linearly proportional to the sense voltage 211 after coupling to a voltage buffer, while the determination of the panel condition by the diagnostic unit 230 is operated with analog circuits, such as analog comparators.

In an alternative embodiment, the sense output 212 can be a digital data or a logic value, provided by the sensing circuit 210, linearly proportional to the sense voltage 211 after digitization. The determination of the panel condition by the diagnostic unit 230 is operated with digital circuits.

The reference generator 220 is a circuit configured to set an upper reference voltage Vref (upper) 221 and a lower reference voltage Vref (lower) 222 for defining the range of values of the sense output 212 that represents a good or a bad condition of the display panel 100. The upper reference voltage Vref (upper) 221 and the lower reference voltage Vref (lower) 222 are determined based on the total capacitance of the plurality of capacitors of the display panel 100, and the signal electrode (VCOM electrode or source lines) that is electrically connected from the display panel 100 to the sensing circuit 210. In order to allow the panel defect detector of the present disclosure operates consistently regardless of the type of the display panel 100 and the characteristics of each individual display panel 100, the upper reference voltage Vref (upper) 221 and the lower reference voltage Vref (lower) 222 are trimmed individually. Normally the trimming is performed after the display driver 200 is attached and electrically connected to the display panel 100, which can fine tune the upper reference voltage Vref (upper) 221 and the lower reference voltage Vref (lower) 222. In one embodiment, the upper reference voltage Vref (upper) 221 and the lower reference voltage Vref (lower) 222 are digital data or a logic values. In case when the diagnostic unit 230 is operated with analog circuits, the reference generator 220 can be a low-voltage circuit instead configured to generate a plurality of stable voltages, preferably using a bandgap reference circuit.

The diagnostic unit 230 has two differential amplifiers 231, 232 and an AND gate 233. Each of the differential amplifiers 231, 232 has an inverted input, a non-inverted input and an output. The sense output 212 is coupled to the inverted input of the first differential amplifier 231, and the upper reference voltage Vref (upper) 221 is coupled to the non-inverted input of the first differential amplifier 231. Similarly, the sense output 212 is also coupled to the non-inverted input of the second differential amplifier 232, and the lower reference voltage Vref (lower) 222 is coupled to the inverted input of the second differential amplifier 232. The output of the first differential amplifier 231 is coupled to one input of the AND gate 233, and the output of the second differential amplifier 232 is coupled another input of the AND gate 233. The diagnostic unit 230 is configured to determine a condition of the display panel 100 based on the sense output 212 by comparing the sense output 212 with an upper reference voltage Vref (upper) 221 and a lower reference voltage Vref (lower) 222, as generated by the reference generator 220. As the sense voltage 211 and the corresponding sense output 212 are proportional to a total capacitance on the display panel 100, a defective panel with abnormal capacitance can be identified.

The output of the AND gate 233 provides a diagnostic result 234, which can reflect on the condition of the display panel 100, and store in a memory 240. The memory 240 can be a register storage, a volatile memory, or a non-volatile memory. The diagnostic result 234 is further transmitted to a communication unit 260 for sending alert on the condition of the display panel 100. In one embodiment, the communication unit 260 is an external system block configured to transmit data through Bluetooth or Wi-Fi, but it can also be embedded within the display driver 200. The transmission can also be implemented by other wireless or wired communication protocols including, but not limited to, Infrared (IR) Communication, Wireless Body Area Network (WBAN), inter-integrated circuit ($I^2C$), low-voltage differential signaling (LVDS), mobile industry processor interface (MIPI), and serial (COM) communication. Caching techniques may also be adopted to guarantee smooth data transmission. The control logic 250 is a digital circuit configured to manage the panel defect detection, by providing control signals to the reference generator 220, sensing circuit 210, memory 240, and communication unit 260.

Figure 2:
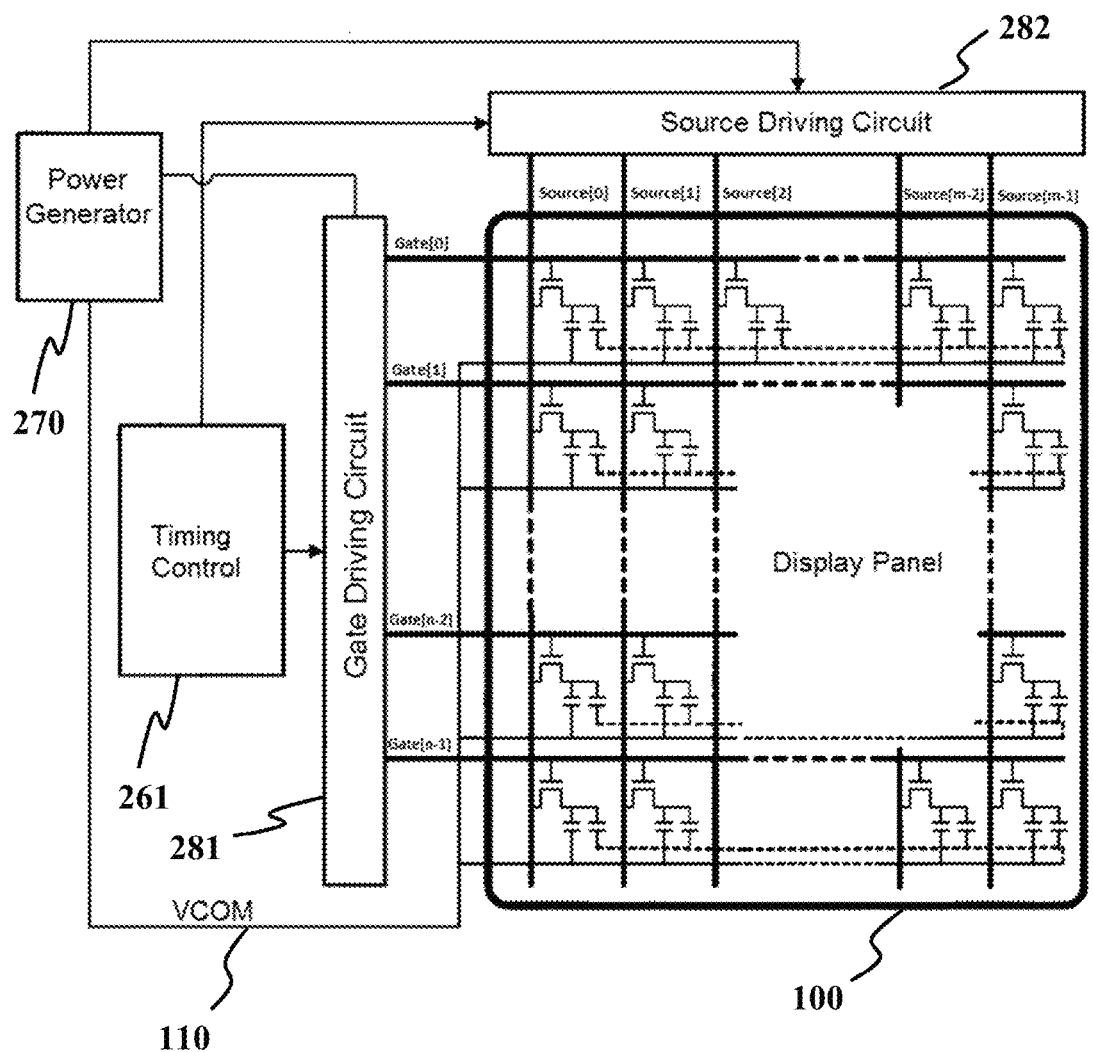
FIG. 2 is a schematic diagram of the display panel and the corresponding driving circuits.
Figure 3:
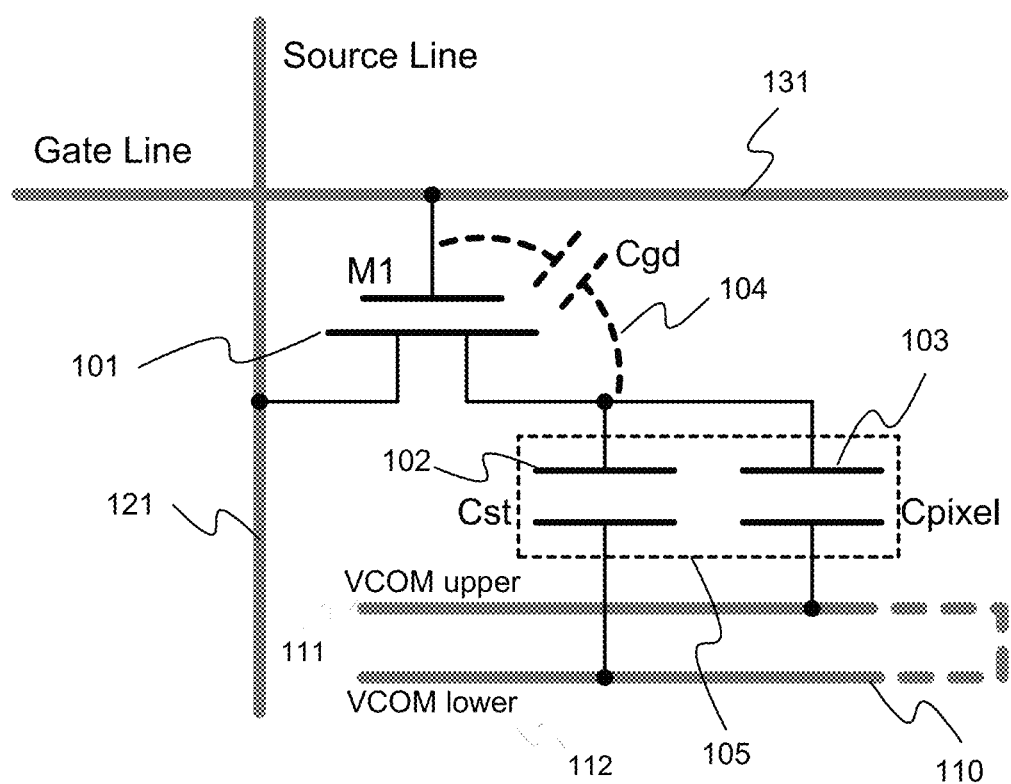
FIG. 3 is a diagram showing the detailed structure of one pixel cell of the display panel.

FIG. 2 shows a schematic diagram of the display panel 100 and the corresponding driving circuits. The display panel 100 is a non-volatile type display, such as an EPD, which can hold static images indefinitely or for a very long duration without electricity. FIG. 3 shows the detailed structure of one pixel cell of the display panel 100. The physical structure of the display panel 100 can be divided into three layers: a TFT array substrate (lower substrate 112), a microencapsulated electrophoretic layer, and an upper substrate 111. The TFT array substrate is a backplate having an array of transistors fabricated thereon. The microencapsulated electrophoretic layer is positioned above the TFT array substrate and utilizes tiny microcapsules filled with electrically charged colored pigment chips suspended in a clear fluid. The microencapsulated electrophoretic layer can change between a light state and a dark state by applying voltage. The upper substrate 111 is the cover glass, deposited with a conductive layer of indium tin oxide (ITO) at the inner side. ITO is a composition which is electrically conductive and optically transparent. Similarly, the lower substrate 112 is also deposited with a conductive layer of ITO. Since the conductive layer of the ITO of the upper substrate 111 and the lower substrate 112 are electrically connected, the upper substrate 111 and the lower substrate 112 can be treated as a VCOM electrode 110. Therefore, the upper substrate 111 and the lower substrate 112 are arranged opposite to each other, and the microencapsulated electrophoretic layer is sandwiched between the upper substrate 111 and the lower substrate 112 to form an array of parallel plate capacitors.

When updating the screen content of an EPD with m columns of bus-lines and n rows of bus-lines, the power generator 270 is configured to output to the VCOM electrode 110 with a VCOM level ranging from 0V to −3V configurable by VCOMSET[7:0]. The power generator 270 is also configured to output to the gate driving circuit 281 with a VGH level ranging from 10V to 20V, and a VGL level ranging from −10V to −20V, and to the source driving circuit 282 with a VSH level ranging from 9V to 17V, and a VSL level ranging from −9V to −17V. The column bus-lines are the source lines 121 connecting the source driving circuit 282 and the source electrodes of the TFTs 101. The source driving circuit 282 can be a circuit configured to generate a plurality of source control signals Source[m−1:0] to the source lines 121, each with an alternating waveform between the VSH level, VSL level, and ground (VSS) level. The row bus-lines are the gate lines 131 connecting the gate driving circuit 281 and the gate electrodes of the TFTs 101. The gate driving circuit 281 can be a circuit configured to generate a plurality of gate control signals Gate[n−1:0] to the gate lines 131, each with an alternating waveform between the VGH level and VGL level. Both the gate driving circuit 281 and the source driving circuit 282 are controlled by a timing control 261.

Referring to FIG. 3, the pixel cell of an EPD comprises a TFT (M1) 101; a storage capacitor (Cst) 102; a pixel element modeled by a pixel capacitor (Cpixel) 103, which is preferably a parallel plate capacitor; and parasitic capacitance modeled by a capacitor (Cgd) 104. The gate electrode and the drain electrode of the TFT 101 are coupled to one gate line 131 and one source line 121 respectively. The source electrode of the TFT 101 is coupled to one end of the display electrode capacitor 105 comprising a storage capacitor 102 and a pixel capacitor 103. The other end of the display electrode capacitor 105 is coupled to the common electrode 110, with the storage capacitor 102 and the pixel capacitor 103 connected to the lower substrate 112 and the upper substrate 111 of the VCOM electrode 110 respectively. The lower substrate 112 and the upper substrate 111 are physically separated but electrically connected through external connection. Therefore, the storage capacitor 102 and the pixel capacitor 103 are connected together to the VCOM electrode 110 in an equivalent circuit. The storage capacitor 102 is positioned proximate to the TFT 101 of the pixel cell, and has a capacitance of 0.5 pF approximately. The storage capacitor 102 can keep a stable voltage across the pixel cell and help to stabilize the source control signals Source[m−1:0]. The pixel capacitor 103 is a capacitor formed between the upper substrate 111 and the lower substrate 112.

Figure 4:
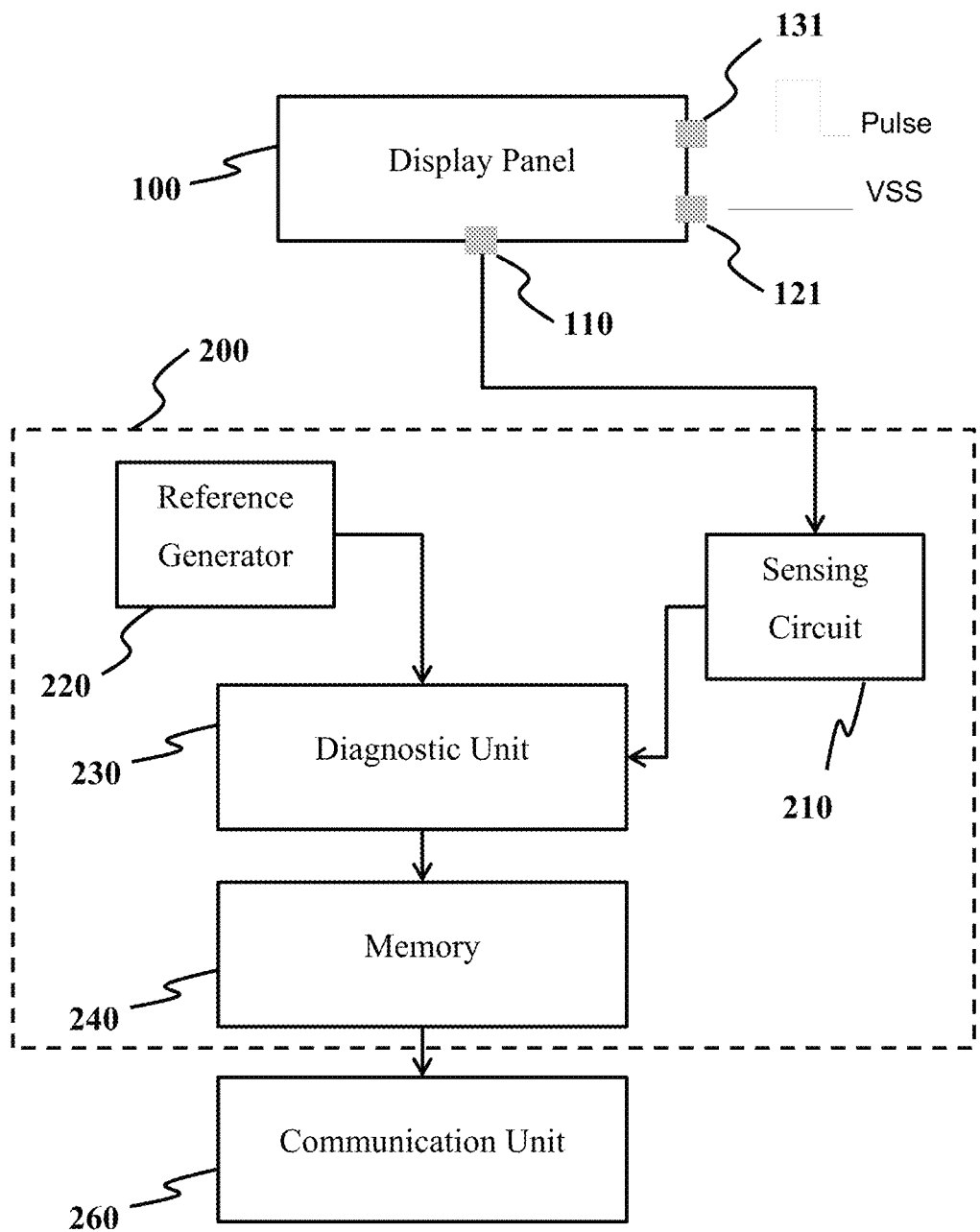
FIG. 4 depicts a block diagram showing the structure of the panel defect detector according to the first embodiment of the present disclosure.

According to the first embodiment of the present disclosure, as demonstrated in FIG. 4, when the display driver 200 performs panel defect detection for a display panel 100, the sensing circuit 210 is electrically connected to the VCOM electrode 110 for signal sensing. The gate driving circuit 281 is configured to generate a plurality of pulses as gate control signals Gate[n−1:0] coupled to the gate lines 131, and the source driving circuit 282 is configured to couple a VSS signal to the source lines 121. The VCOM electrode 110 of the display panel 100 is electrically connected to the sensing circuit 210 for coupling a sense voltage 211 to the sensing circuit 210. As the VCOM electrode 110 is connected to the plural display electrode capacitors 105 of the plural pixel cells, the sense voltage 211 is the voltage at VCOM electrode 110 after discharging gradually by the plural display electrode capacitors 105 of the plural pixel cells. Therefore, the sense voltage 211 is proportional to the total capacitance of the plural display electrode capacitors 105 on the plural pixel cells of the display panel 100. The sensing circuit 210 is configured to receive a sense voltage 211 from the VCOM electrode and generate a sense output 212 for the diagnostic unit 230 to determine the condition of the display panel 100.

Figure 5A:
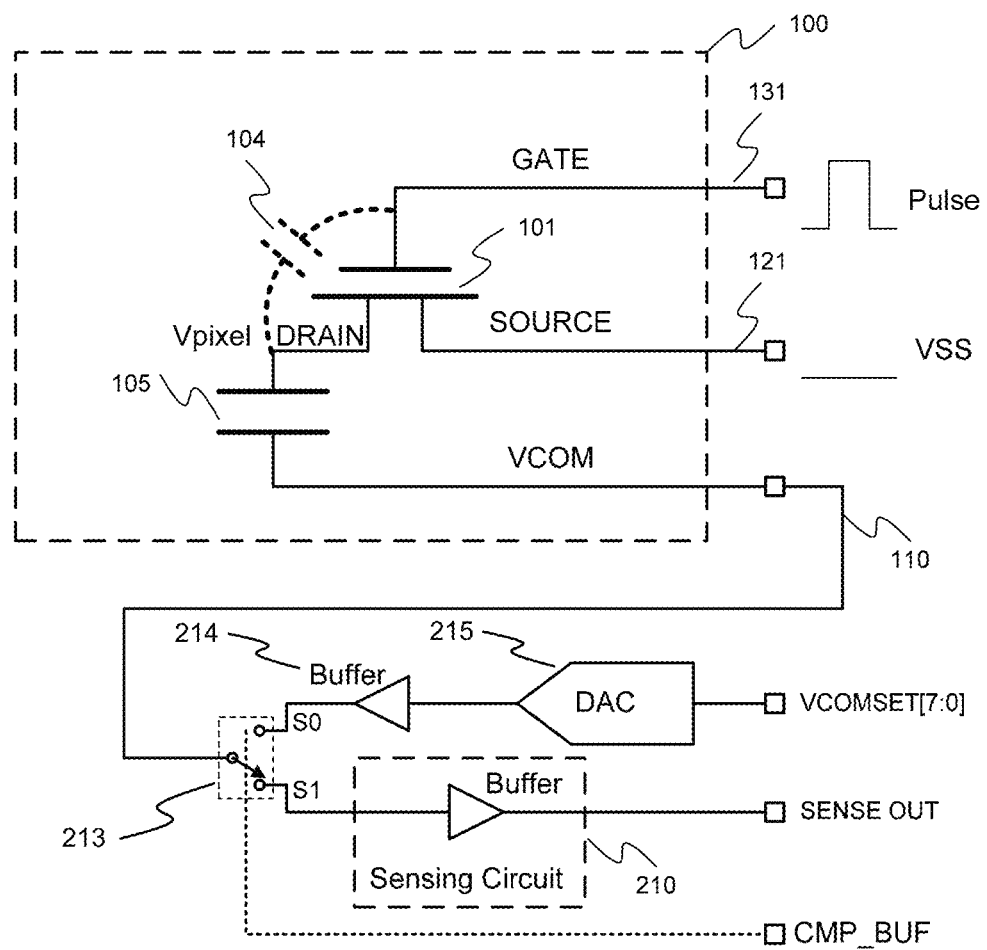
FIGS. 5A and 5B depict block diagrams demonstrating the mechanism of the signal sensing according to the first embodiment of the present disclosure.
Figure 5B:
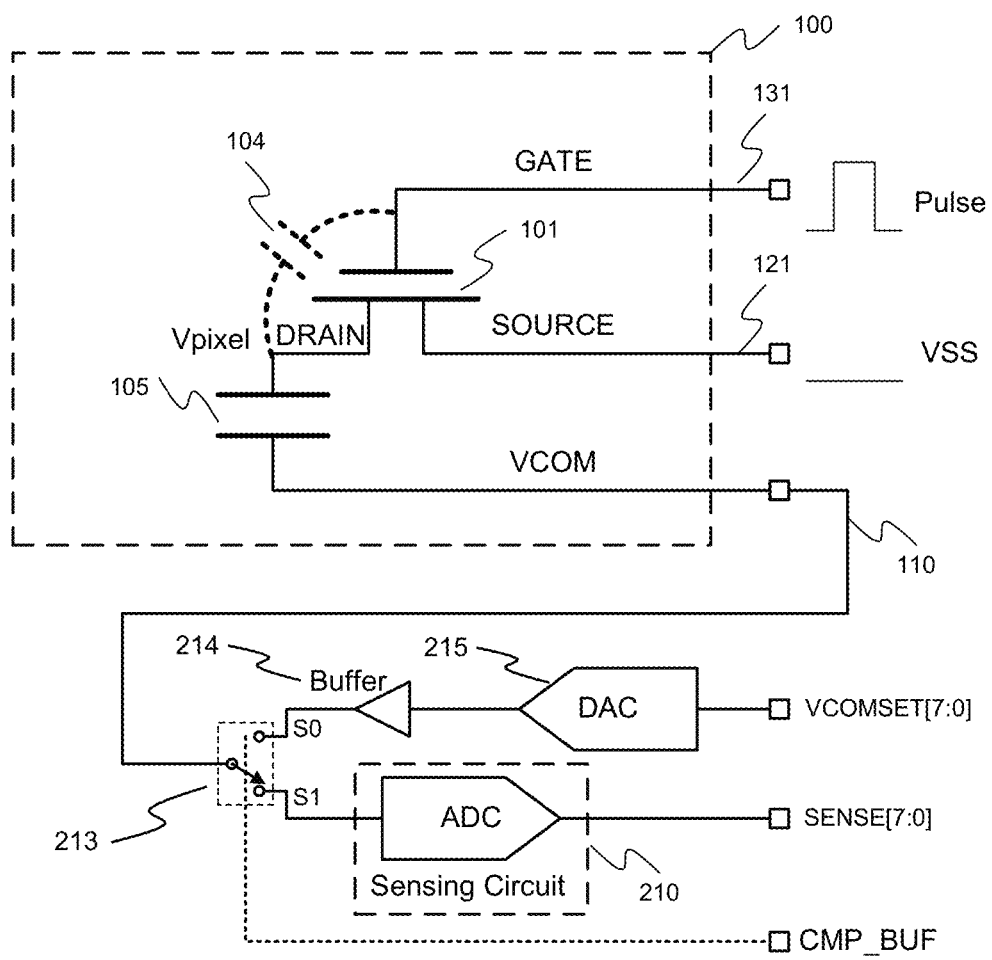

FIGS. 5A and 5B provide detailed mechanism of the signal sensing respectively based on an analog sense output 212 and a digital sense output 212 according to the first embodiment of the present disclosure. When the display driver 200 is not performing panel defect detection, the switch 213 is switched to S0 such that the digital setting for VCOMSET[7:0] defines the voltage at the VCOM terminal 110, by coupling the VCOMSET[7:0] to a digital-to-analog converter (DAC) 215 and a voltage buffer 214. Conversely, when the display driver 200 is performing panel defect detection, the switch 213 is switched to S1. Referring to FIG. 5A, the sensing circuit 210 is connected to the VCOM terminal 110 for obtaining an analog voltage SENSE OUT. The sensing circuit 210 can be implemented by a voltage buffer and the switch 213 is controlled by a digital control signal CMP_BUF. Now referring to FIG. 5B for the case when the sense output 212 is a digital data, an analog to digital converter (ADC) can be used to replace the voltage buffer as the sensing circuit 210.

With the configurations of the first embodiment, when the TFTs 101 on each row of pixel cells are enabled by the pulse of VGH level coupled to the gate line 131 for a pre-determined duration, for instance, 50 microsecond (µs), the drain electrode and the source electrode of each TFT 101 on a row of pixel cells are momentarily connected for the pre-determined duration. Hence, the voltage at the VCOM electrode 110 is slightly discharged by the plural display electrode capacitors 105 on that row of pixel cells. The signal coupled to the gate line 131 is then dropped from VGH level to VGL level to provide a falling edge at the gate control signal after the pre-determined duration, some charges are injected and sucked in the VCOM electrode 110 by the parasitic capacitor 104. As the TFTs 101 of the pixel cells are enabled line by line horizontally, each for the pre-determined duration, the VCOM electrode 110 is slowly discharged by the display electrode capacitors 105 on the display panel 100 to a stable voltage. If there is any current leakage, or capacitance abnormality, the stable voltage at the VCOM electrode 110 will not be bounded by the Vref (upper) 221 and the Vref (lower) 222 from the reference generator 220.

Figure 6:
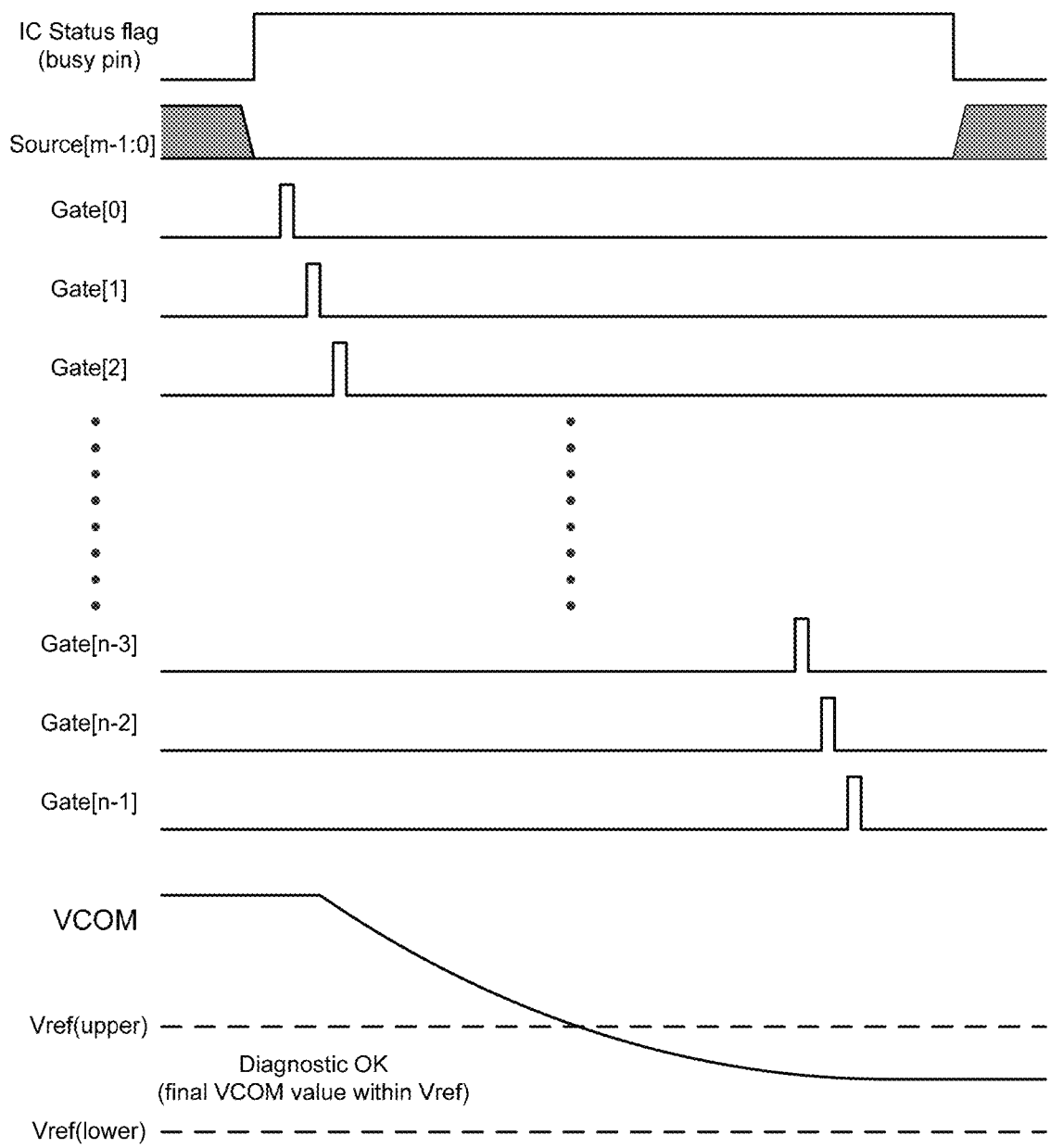
FIG. 6 is a signal diagram depicting signals supplied to the source lines and gate lines, and signal measured from the VCOM electrode when the panel is not defective.
Figure 7:
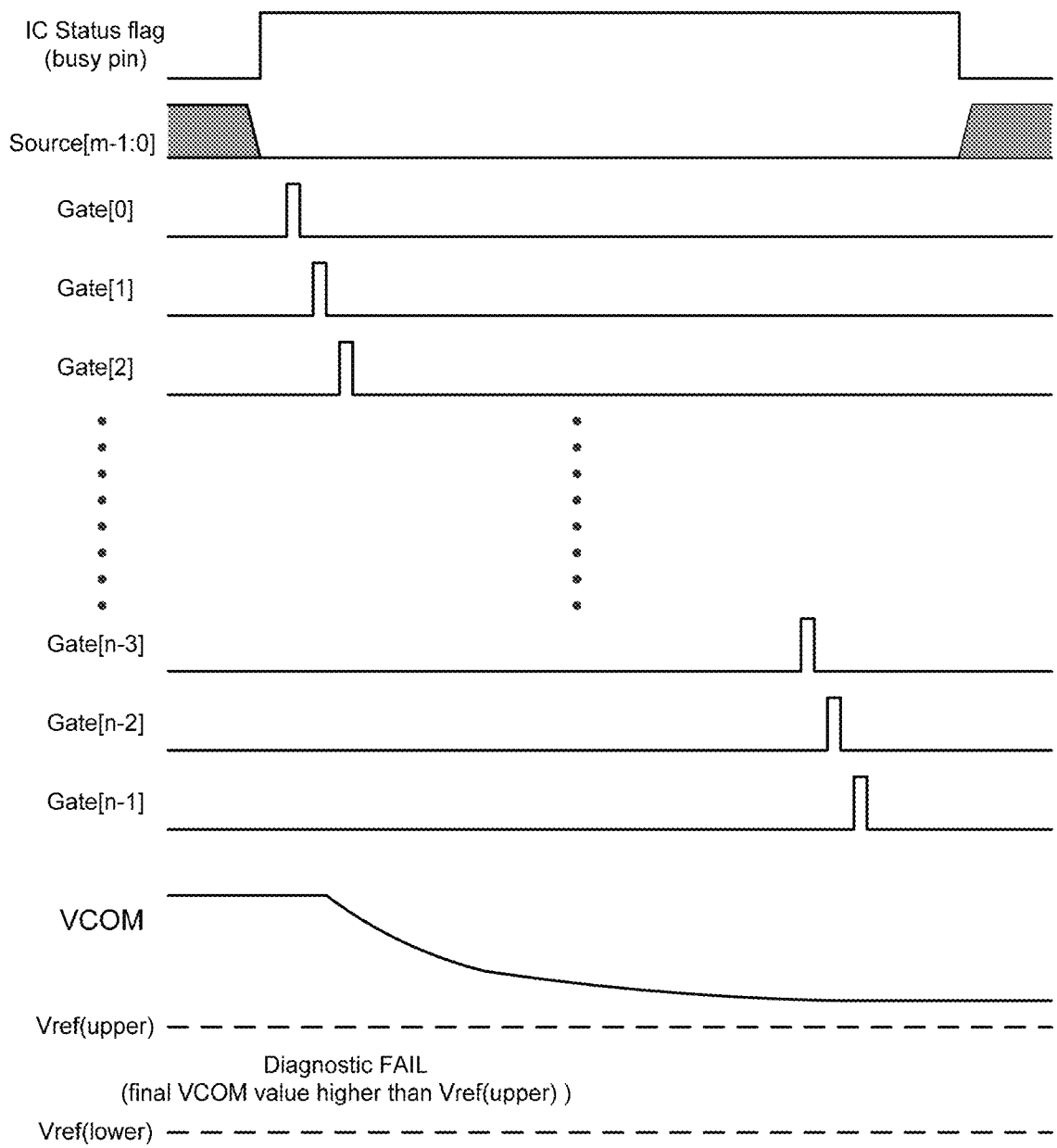
FIG. 7 is a signal diagram depicting signals supplied to the source lines and gate lines, and signal measured from the VCOM electrode when the panel is defective with a higher VCOM value.
Figure 8:
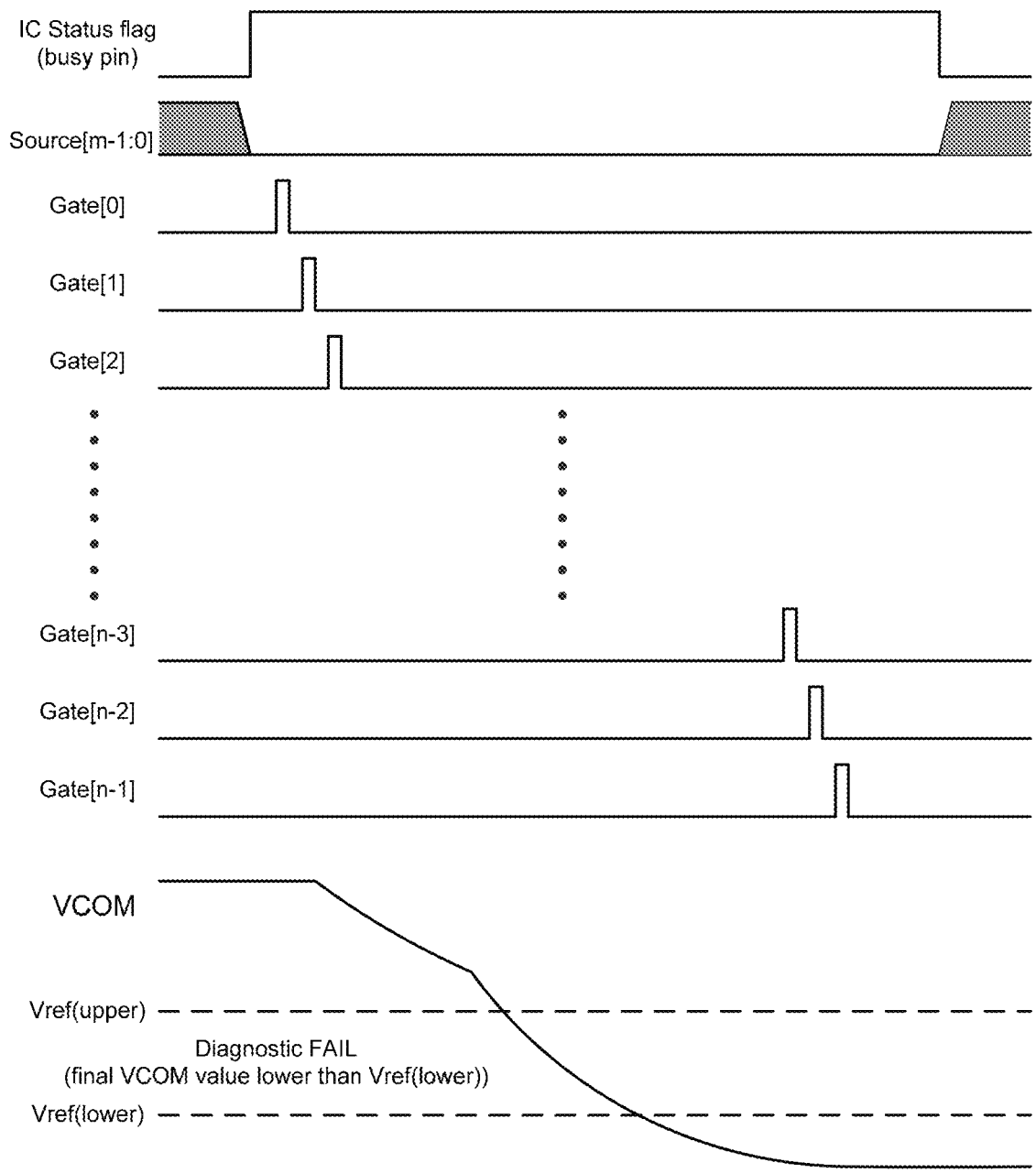
FIG. 8 is a signal diagram depicting signals supplied to source lines and gate lines, and signal measured from the VCOM electrode when the panel is defective with a lower VCOM value.

FIGS. 6-8 are the signal diagrams each depicting signals supplied to the source lines 121 and gate lines 131, and signal measured from the VCOM electrode 110 as compared with the Vref (upper) 221 and the Vref (lower) 222 from the reference generator 220 in accordance with the first embodiment of the present disclosure when the condition of the display panel 100 is good or defective. As shown in the signal waveforms for the gate lines 131, a pre-determined duration of a VGH level is coupled to the gate electrodes of each row of the pixel cells in a sequential and interleaving manner from Gate[0] to Gate[n−1]. However, it is apparent to those skilled in the art that the sequence for enabling the gate electrodes may be arranged in other orders or randomly, and some of the gate electrodes may also be enabled simultaneously or spaced out with periods of time where none of the gate electrodes is enabled. The source lines 121 are all coupled with a VSS level in the first embodiment and the IC status flag is set to high to indicate that the display driver 200 is performing panel defect detection.

Referring to FIG. 6, the voltage at the VCOM electrode 110 is discharged gradually by the plural display electrode capacitors 105 of the plural pixel cells when a pulse of VGH level is coupled to the gate electrode of each TFT line by line during voltage sensing. As the resulting voltage level after discharging by the plurality of capacitors is bounded between Vref (upper) 221 and Vref (lower) 222, the display panel 100 is ascertained as normal without any defect at the pixel cells or traces.

Referring to FIG. 7, the voltage at the VCOM electrode 110 is discharged gradually by the plural display electrode capacitors 105 of the plural pixel cells with a smaller voltage decrement when a pulse of VGH level is coupled to the gate electrode of each TFT line by line during voltage sensing. The resulting voltage level after discharging by the plurality of capacitors is not bounded between Vref (upper) 221 and Vref (lower) 222, with a voltage higher than the Vref (upper) 221. Therefore, the display panel 100 is ascertained as defective and the defect could be caused by an open circuit at some or all of the pixel cells, broken traces at some or all of the gate lines 131, source lines 121, and/or VCOM electrode 110.

Referring to FIG. 8, the voltage at the VCOM electrode 110 is discharged significantly faster by the plural display electrode capacitors 105 of the plural pixel cells with a greater voltage decrement when a pulse of VGH level is coupled to the gate electrode of each TFT line by line during voltage sensing. The resulting voltage level after discharging by the plurality of capacitors is not bounded between Vref (upper) 221 and Vref (lower) 222, with a voltage lower than the Vref (lower) 222. Therefore, the display panel 100 is ascertained as defective and the defect could be caused by a leakage path, which can be located at some or all of the pixel cells, gate lines 131, source lines 121, and/or VCOM electrode 110.

Figure 9:
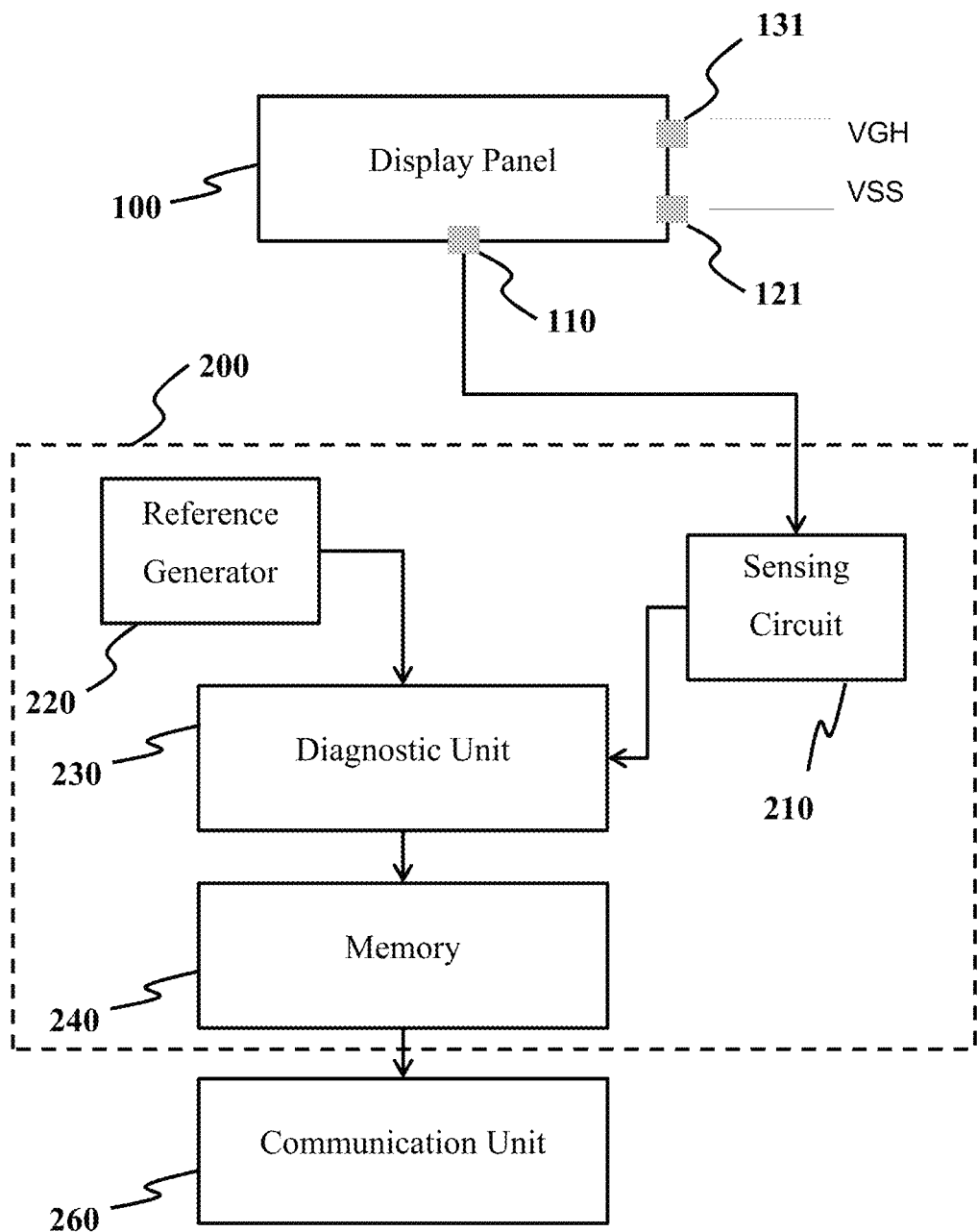
FIG. 9 depicts a block diagram showing the structure of the panel defect detector according to the second embodiment of the present disclosure.

According to the second embodiment of the present disclosure, as demonstrated in FIG. 9, when the display driver 200 performs panel defect detection for a display panel 100, the sensing circuit 210 is electrically connected to the VCOM electrode 110 for signal sensing. The source driving circuit 282 is configured to couple a VSS signal to the source lines 121. The gate driving circuit 281 is configured to generate a stable VGH level to the gate lines 131, such that all the TFTs 101 are enabled when performing the voltage sensing for determining the panel condition. The VCOM electrode 110 of the display panel 100 is electrically connected to the sensing circuit 210 for coupling a sense voltage 211 to the sensing circuit 210. As the VCOM electrode 110 is connected to display electrode capacitor 105, the sense voltage 211 is the voltage at VCOM electrode 110 after discharging through the plural display electrode capacitors 105. Therefore, then sense voltage 211 is proportional to the total capacitance of the plural display electrode capacitors 105 on the plural pixel cells of the display panel 100. The sensing circuit 210 is configured to receive a sense voltage 211 from the VCOM electrode and generate a sense output 212 for the diagnostic unit 230 to determine the condition of the display panel 100.

Figure 10:
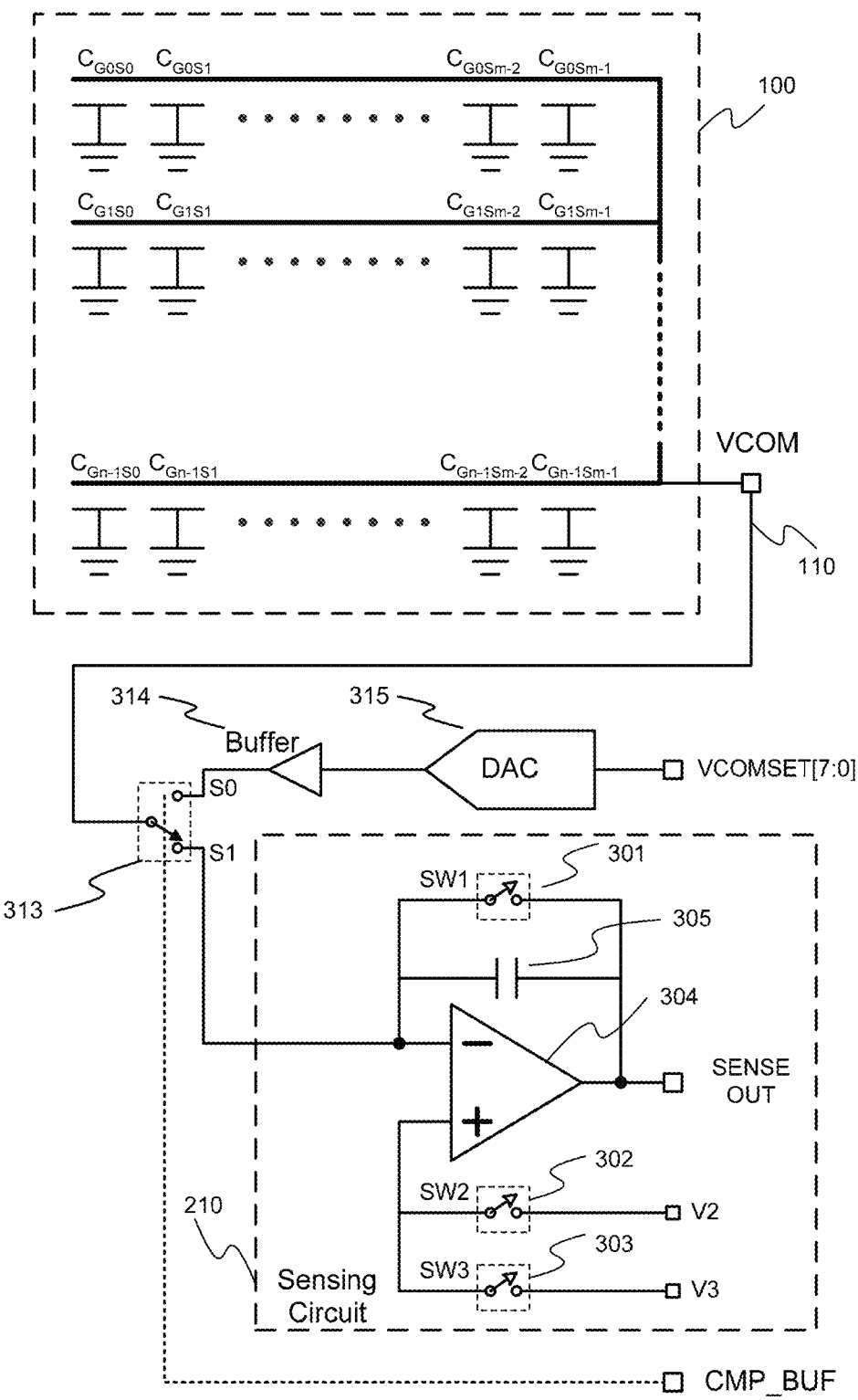
FIG. 10 depicts a block diagram demonstrating the mechanism of the signal sensing according to the second embodiment of the present disclosure.

FIG. 10 provides a detailed mechanism of the signal sensing according to the second embodiment of the present disclosure. When the display driver 200 is not performing panel defect detection, the switch 313 is switched to S0 such that the digital setting for VCOMSET[7:0] defines the voltage at the VCOM terminal 110, by coupling the VCOMSET[7:0] to a DAC 315 and a voltage buffer 314. Conversely, when the display driver 200 is performing panel defect detection, the switch 313 is switched to S1 such that the sensing circuit 210 is connected to the VCOM terminal 110 for obtaining an analog voltage (SENSE OUT). The switch 313 is controlled by a digital control signal CMP_BUF. The sensing circuit 210 can be implemented by using a plurality of switches SW1 301, SW2 302, SW3 303, a capacitor 305 and a differential amplifier 304.

When the panel defect detection is enabled, all the gate electrodes of the TFTs 101 on the display panel 100 are enabled by the VGH level at the gate lines 131. The drain electrode and the source electrode of the TFTs 101 are connected. By connecting all the source lines 121 to VSS level, all the drain electrodes of the TFTs 101 on the display panel 100 are coupled with a VSS level, therefore one terminal of each display electrode capacitor 105 is connected to the VCOM electrode 110 and the other terminal of the display electrode capacitor 105 is connected to VSS level, forming an array of capacitors at the VCOM electrode 110.

Figure 11:
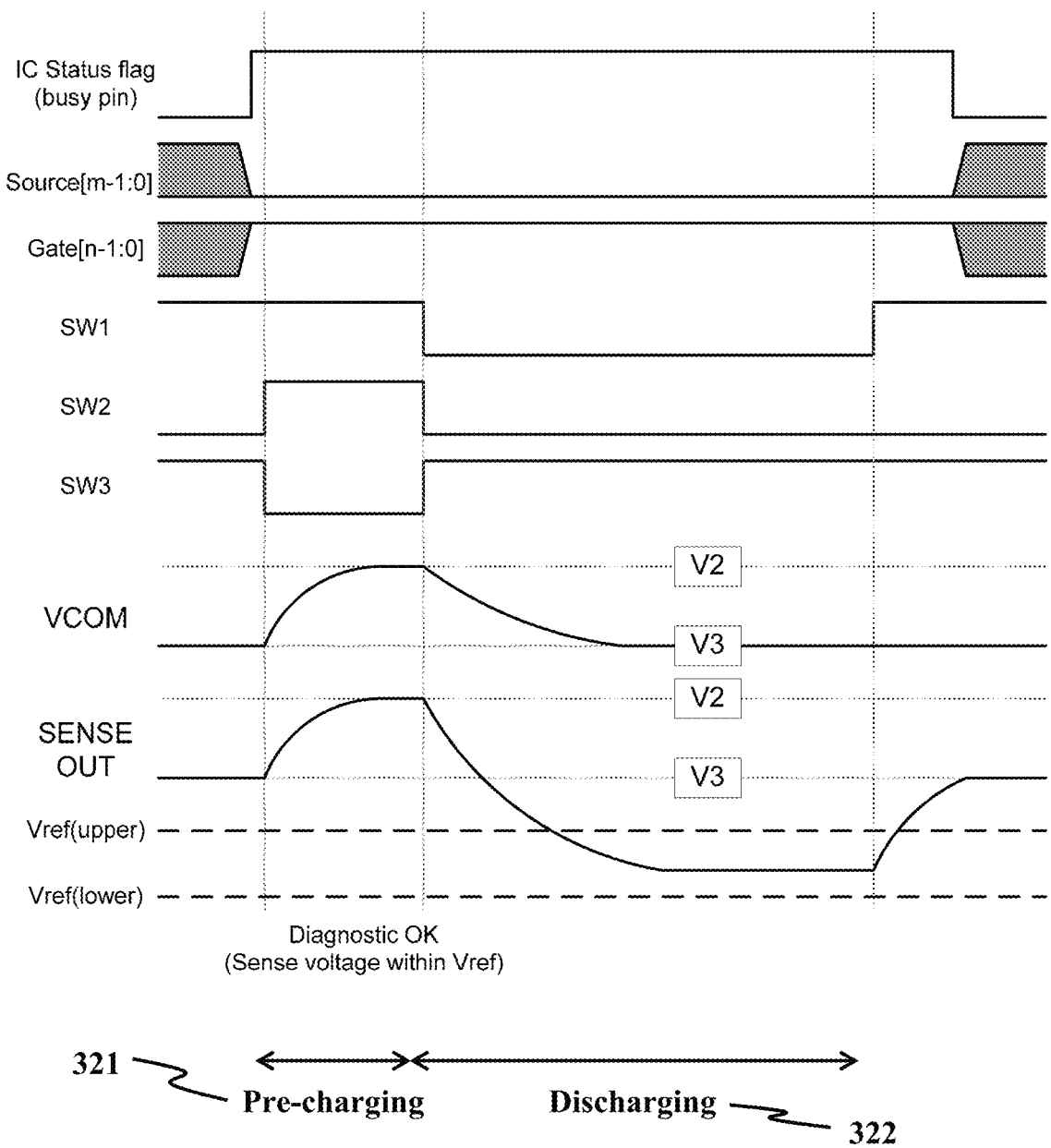
FIG. 11 is a signal diagram depicting signals controlling switches SW1, SW2 and SW3, and the corresponding signals measured from the VCOM electrode and the SENSE OUT signal when the panel is not defective.
Figure 12:
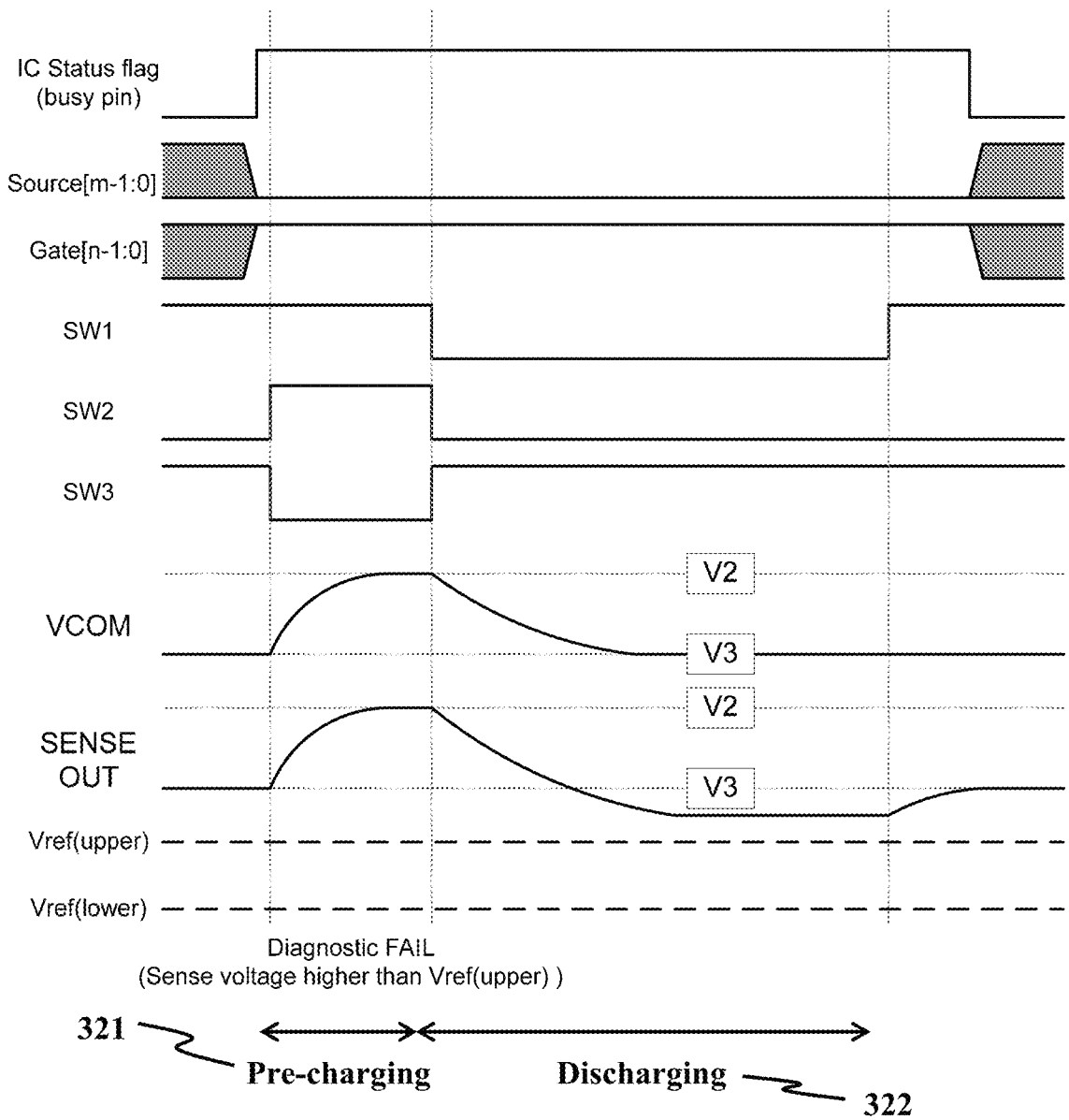
FIG. 12 is a signal diagram depicting signals controlling switches SW1, SW2 and SW3, and the corresponding signals measured from the VCOM electrode and the SENSE OUT signal when the panel is defective with a higher voltage level at SENSE OUT.
Figure 13:
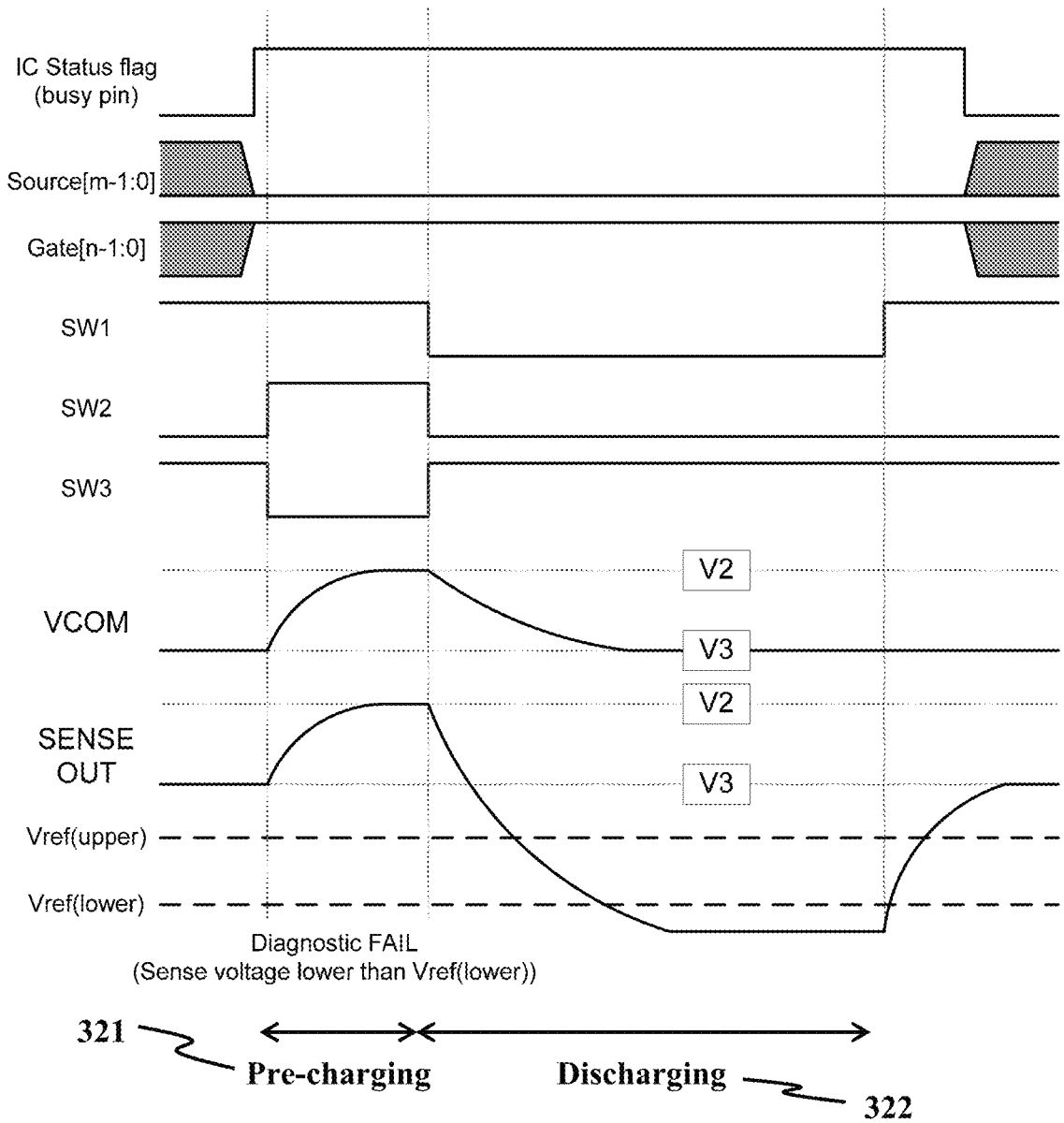
FIG. 13 is a signal diagram depicting signals controlling switches SW1, SW2 and SW3, and the corresponding signals measured from the VCOM electrode and the SENSE OUT signal when the panel is defective with a lower voltage level at SENSE OUT.

Referring to FIGS. 11-13, when sensing the voltage from VCOM terminal 110 for determining the condition of the display panel 100, the SW1 301, SW2 302, and SW3 303 are set to "logic high", "logic high", and "logic low" respectively for the pre-charging period 321, then set to "logic low", "logic low" and "logic high" respectively for the discharging period 322. During the pre-charging period 321, the differential amplifier 304 operates as a non-inverting voltage follower such that both the output and the positive input of the differential amplifier 304 have V2 level. During the discharging period 322, VCOM electrode is discharged to V3 level, and the voltage level at the SENSE OUT is discharged further lower than the V3 level.

Referring to FIG. 11, the voltage at SENSE OUT is discharged gradually by the plural display electrode capacitors 105 of the plural pixel cells during the discharging period 322. As the resulting voltage level after discharging by the plurality of capacitors is bounded between Vref (upper) 221 and Vref (lower) 222, the display panel 100 is ascertained as normal without any defect at the pixel cells or traces.

Referring to FIG. 12, the voltage at SENSE OUT is discharged gradually by the plural display electrode capacitors 105 of the plural pixel cells with a smaller voltage decrement during the discharging period 322. The resulting voltage level after discharging by the plurality of capacitors is not bounded between Vref (upper) 221 and Vref (lower) 222, with a voltage higher than the Vref (upper) 221. Therefore, the display panel 100 is ascertained as defective and the defect could be caused by an open circuit at some or all of the pixel cells, broken traces at some or all of the gate lines 131, source lines 121, and/or VCOM electrode 110.

Referring to FIG. 13, the voltage at SENSE OUT is discharged significantly faster by the plural display electrode capacitors 105 of the plural pixel cells with a greater voltage decrement during the discharging period 322. The resulting voltage level after discharging by the plurality of capacitors is not bounded between Vref (upper) 221 and Vref (lower) 222, with a voltage lower than the Vref (lower) 222. Therefore, the display panel 100 is ascertained as defective and the defect could be caused by a leakage path, which can be located at some or all of the pixel cells, gate lines 131, source lines 121, and/or VCOM electrode 110.

Figure 14:
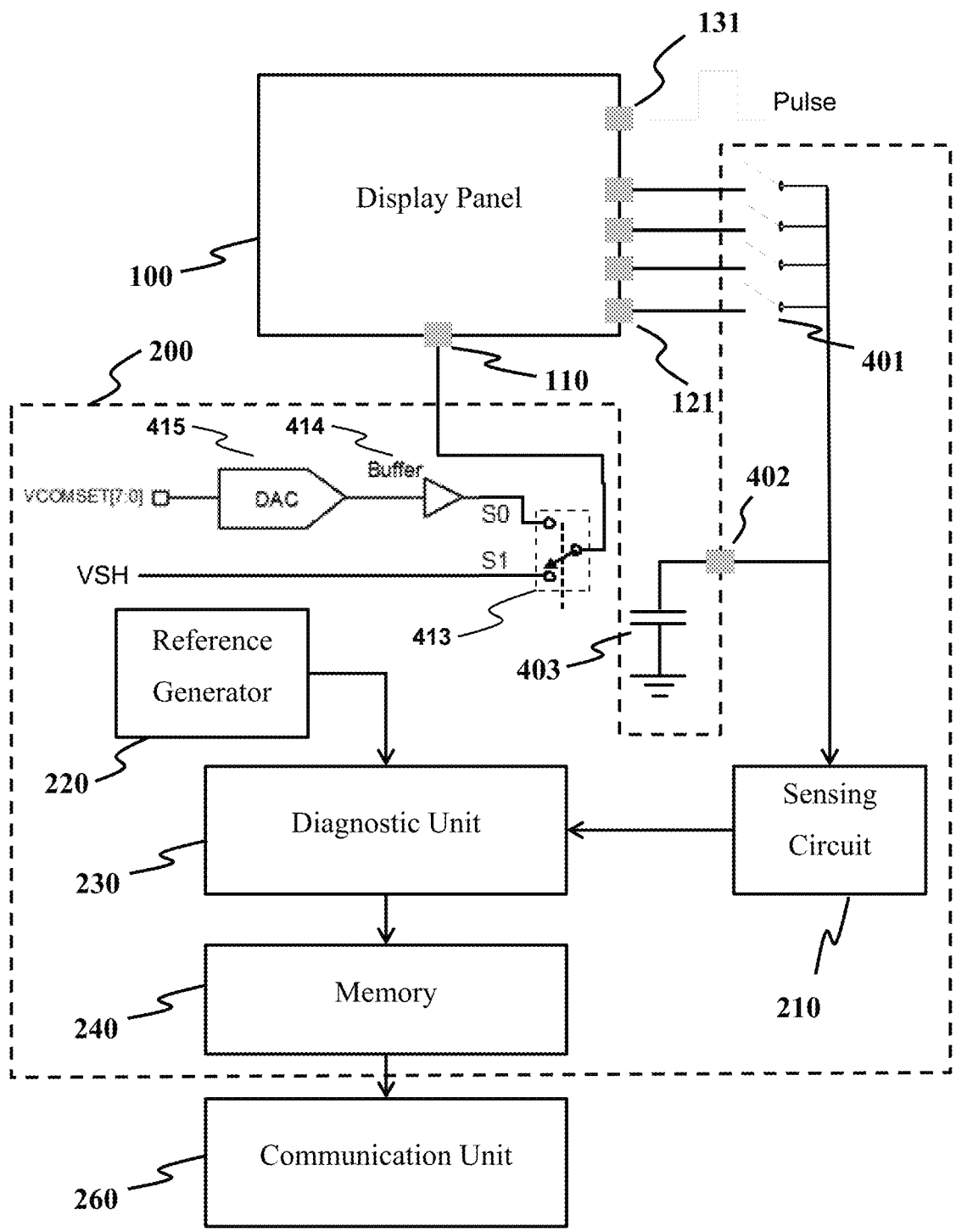
FIG. 14 depicts a block diagram showing the structure of the panel defect detector according to the third embodiment of the present disclosure.

According to the third embodiment of the present disclosure, FIG. 14 demonstrates the configuration when the display driver 200 performs panel defect detection for a display panel 100. The sensing circuit 210 is electrically connected to all the source lines 121 for signal sensing. The gate driving circuit 281 is configured to generate a plurality of pulses as gate control signals Gate[n−1:0] coupled to the gate lines 131. The switch 413 is switched to S1 such that a stable voltage of VSH level is coupled to the VCOM electrode 110. All the switches 401 are closed and all the source lines 121 of the display panel 100 are electrically connected to the sensing circuit 210 for coupling a sense voltage 211 to the sensing circuit 210, and an external capacitor 403 is connected to the source lines 121 at a connector pin 402. The external capacitor 403 is configured to have a capacitance value approximately the same as the total capacitance of the plurality of capacitors of the display panel 100. When the display driver 200 is not performing panel defect detection, the switch 413 is switched to S0 such that the digital setting for VCOMSET[7:0] defines the voltage at the VCOM terminal 110, by coupling the VCOMSET[7:0] to a DAC 415 and a voltage buffer 414. The switches 401 are all opened and the source lines 121 are disconnected from the sensing circuit 210 and the external capacitor 403.

With the configurations of the third embodiment, when the TFTs 101 on each row of pixel cells are enabled by the pulse of VGH level coupled to the gate line 131 for a pre-determined duration, for instance, 50 μs, the drain electrode and the source electrode of the TFT 101 are momentarily connected for the pre-determined duration. Hence, the circuit is equivalent to a series connection the plural display electrode capacitors 105 of the plural pixel cells on the display panel 100 and the external capacitor 403, with one end of the circuit connecting to the VSS level and the other end of the circuit connecting to the VSH level. The sense voltage 211 is measured at the junction between the plural display electrode capacitors 105 and the external capacitor 403. As the external capacitor 403 is configured to have a capacitance value approximately the same as the total capacitance of the plurality of capacitors of the display panel 100, the sense voltage 211 expected for a normal panel can easily be defined.

Figure 15:
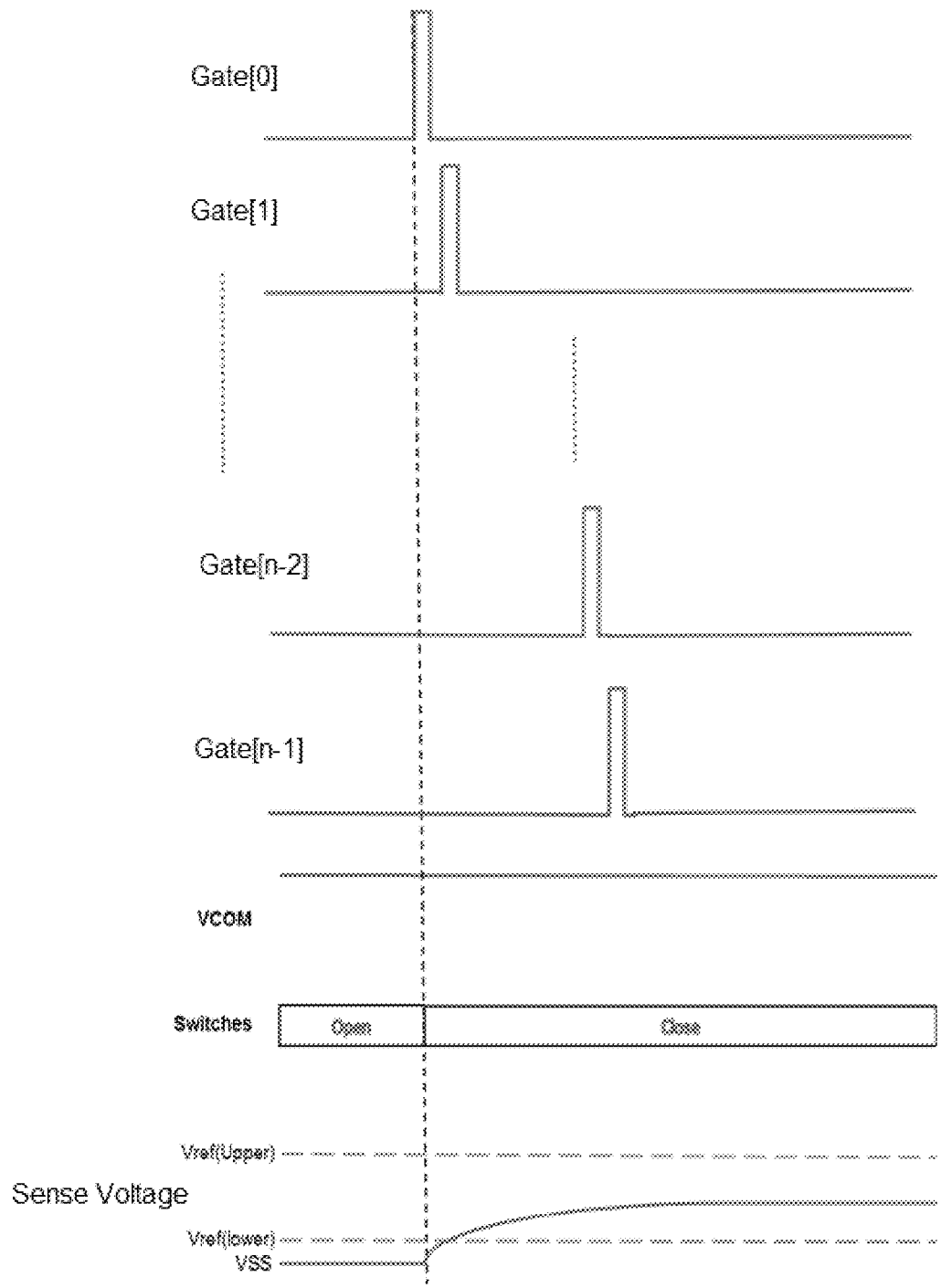
FIG. 15 is a signal diagram depicting signals supplied to the gate electrodes and VCOM electrode, and the sense voltage obtained when the panel is not defective.

FIG. 15 is the signal diagram depicting signals supplied to the gate lines 131 and the VCOM electrode 110, and sense voltage measured from the source lines 121 as compared with the Vref (upper) 221 and the Vref (lower) 222 from the reference generator 220 in accordance with the third embodiment of the present disclosure when the condition of the display panel 100 is good. As shown in the signal waveforms for the gate lines 131, a pre-determined duration of a VGH level is coupled to the gate electrodes of each row of the pixel cells in a sequential and interleaving manner from Gate[0] to Gate[n−1]. However, it is apparent to those skilled in the art that the sequence for enabling the gate electrodes may be arranged in other orders or randomly, and some of the gate electrodes may also be enabled simultaneously or spaced out with periods of time where none of the gate electrodes is enabled.

The external capacitor 403 is charged gradually by the plural display electrode capacitors 105 when all the source lines 121 are connected to the external capacitor 403 and the sensing circuit 210. After charging the external capacitor 403, if the sense voltage 211 is bounded between Vref (upper) 221 and Vref (lower) 222, the display panel 100 is ascertained as normal without any defect at the pixel cells or traces. Similar to the first and second embodiments, after charging the external capacitor 403, if the sense voltage 211 is not bounded between Vref (upper) 221 and Vref (lower) 222, the display panel 100 is ascertained as defective. The defect could be caused by a leakage path, which can be located at some or all of the pixel cells, gate lines 131, source lines 121, and/or VCOM electrode 110.

As described above, the present invention provides a novel method for detecting panel defect in a non-volatile type display panel 100. Voltage sensing is performed at VCOM electrode 110 or source lines 121 for determining the condition of the display panel 100 based on the total capacitance of the plurality of capacitance of the display panel 100. Unlike the conventional approaches, extra conductive wire around or inside the display area for detection is not necessary. Therefore, the size of the display bezel can be minimized such that a more compact design of the EPD is achievable. Furthermore, the structure of the display panel 100 is not changed after implementing the present panel defect detection method, allowing the deployment of the present invention on all general and conventional non-volatile type display.

It will be apparent to those skilled in the art that various modifications and variations can be made to the method and the system of the present invention without departing from the scope or spirit of the present disclosure. In view of the foregoing descriptions, it is intended that the present disclosure covers modifications and variations if they fall within the scope of the following claims and their equivalents.

What is claimed is:

1. A panel defect detection method for an electronic paper display (EPD) capable of displaying a retained image without consuming power after a screen update, the EPD comprising plural pixel cells, each of the pixel cells comprising a thin film transistor (TFT), a display electrode capacitor, a gate line coupled to a gate electrode of the TFT, a source line coupled to a drain electrode of the TFT, a source electrode of the TFT coupled to one end of the display electrode capacitor, and a voltage for common (VCOM) electrode coupled to another end of the display electrode capacitor, the method comprising the steps of:

discharging the VCOM electrode through the plural display electrode capacitors to generate a sense voltage, wherein the sense voltage is proportional to a total capacitance of the plural display electrode capacitors on the plural pixel cells of the EPD;

electrically connecting the VCOM electrode to a sensing circuit for generating a sense output from the sense voltage;

comparing the sense output with an upper reference voltage and a lower reference voltage; and determining, by a diagnostic unit, a condition of the EPD based on a voltage decrement at the VCOM electrode when discharging the VCOM electrode through the plural display electrode capacitors, wherein:

the EPD is normal if the sense output is bounded by the upper reference voltage and the lower reference voltage; and at least some of the plural pixel cells is are defective if the sense output is not bounded by the upper reference voltage and the lower reference voltage.

2. The method of claim 1, wherein the step of comparing the sense output with the upper reference voltage and the lower reference voltage comprises:

coupling the sense output to an inverted input of a first differential amplifier and coupling the upper reference voltage to a non-inverted input of the first differential amplifier;

coupling the sense output to a non-inverted input of a second differential amplifier and coupling the lower reference voltage to an inverted input of the second differential amplifier; and coupling an output of the first differential amplifier to one input of an AND gate and coupling an output of the second differential amplifier to another input of the AND gate.

3. The method of claim 1, wherein the upper reference voltage and the lower reference voltage are determined by a reference generator based on the total capacitance of the plural display electrode capacitors on the plural pixel cells of the EPD.

4. The method of claim 1, wherein the sense output is generated from the sense voltage using an analog-to-digital converter.

5. The method of claim 1, wherein the step of discharging the VCOM electrode through the plural display electrode capacitors to generate the sense voltage comprises the steps of:

coupling a VSS level to the source lines of each of the pixel cells; and coupling a pulse of VGH level to each of the gate lines, such that the TFTs on each row of the pixel cells are enabled for a pre-determined duration.

6. The method of claim 5, wherein the TFTs on each row of the pixel cells are enabled in a sequential and interleaving manner by generating plural pulses of VGH level for the gate lines, wherein each pulse is not overlapped with other pulses.

7. The method of claim 1, wherein the step of discharging the VCOM electrode through the plural display electrode capacitors to generate the sense voltage comprises the steps of:

coupling a VSS level to the source lines of each of the pixel cells; and coupling a VGH level to the gate lines of each of the pixel cells, such that all the TFTs are enabled when determining the condition of the EPD.

8. A panel defect detection method for an electronic paper display (EPD) capable of displaying a retained image without consuming power after a screen update, the EPD comprising plural pixel cells, each of the pixel cells comprising a thin film transistor (TFT), a display electrode capacitor, a gate line coupled to a gate electrode of the TFT, a source line coupled to a drain electrode of the TFT, a source electrode of the TFT coupled to one end of the display electrode capacitor, and a voltage for common (VCOM) electrode coupled to another end of the display electrode capacitor, the method comprising the steps of:

coupling a VSH level to the VCOM electrode;

coupling a pulse of VGH level to each of the gate lines, such that the TFTs on each row of the pixel cells are enabled for a pre-determined duration;

electrically connecting the source lines of the EPD to an external capacitor to charge the external capacitor through the plural display electrode capacitors to a sense voltage, wherein the sense voltage is proportional to a total capacitance of the plural display electrode capacitors on the plural pixel cells of the EPD;

electrically connecting the external capacitor to a sensing circuit for generating a sense output from the sense voltage;

comparing the sense output with an upper reference voltage and a lower reference voltage; and determining, by a diagnostic unit, a condition of the EPD based on a voltage increment across the external capacitor when charging the external capacitor through the plural display electrode capacitors, wherein:

the EPD is normal if the sense output is bounded by the upper reference voltage and the lower reference voltage; and at least some of the plural pixel cells are defective if the sense output is not bounded by the upper reference voltage and the lower reference voltage.

9. The method of claim 8, wherein the step of comparing the sense output with the upper reference voltage and the lower reference voltage comprises:

coupling the sense output to an inverted input of a first differential amplifier and coupling the upper reference voltage to a non-inverted input of the first differential amplifier;

coupling the sense output to a non-inverted input of a second differential amplifier and coupling the lower reference voltage to an inverted input of the second differential amplifier; and coupling an output of the first differential amplifier to one input of an AND gate and coupling an output of the second differential amplifier to another input of the AND gate.

10. The method of claim 8, wherein the external capacitor has a capacitance equivalent to the total capacitance of the plural display electrode capacitors on the plural pixel cells of the EPD.

11. An electronic paper display (EPD) driver apparatus for driving the EPD capable of displaying a retained image without consuming power after a screen update and detecting panel defects on the EPD, the EPD comprising plural pixel cells, each of the pixel cells comprising a thin film transistor (TFT), a display electrode capacitor, a gate line coupled to a gate electrode of the TFT, a source line coupled to a drain electrode of the TFT, a source electrode of the TFT coupled to one end of the display electrode capacitor, and a voltage for common (VCOM) electrode coupled to another end of the display electrode capacitor, the EPD driver apparatus comprising:

a sensing circuit configured to receive a sense voltage from the VCOM electrode of the EPD after discharging the VCOM electrode through the plural display electrode capacitors, and to generate a sense output, wherein the sense voltage is proportional to a total capacitance of the plural display electrode capacitors on the plural pixel cells of the EPD;
a reference generator configured to generate an upper reference voltage and a lower reference voltage; and
a diagnostic unit configured to determine a condition of the EPD based on a voltage decrement at the VCOM electrode when discharging the VCOM electrode through the plural display electrode capacitors, wherein:
the EPD is normal if the sense output is bounded by the upper reference voltage and the lower reference voltage; and
at least some of the plural pixel cells are defective if the sense output is not bounded by the upper reference voltage and the lower reference voltage.

12. The EPD driver apparatus of claim 11 further comprising a first differential amplifier and a second differential amplifier, wherein:
the sense output is coupled to an inverted input of the first differential amplifier and a non-inverted input of the second differential amplifier;
the upper reference voltage is coupled to a non-inverted input of the first differential amplifier;
the lower reference voltage is coupled to an inverted input of the second differential amplifier;
an output of the first differential amplifier is coupled to a first input of an AND gate; and
an output of the second differential amplifier is coupled to a second input of the AND gate.

13. The EPD driver apparatus of claim 11 further comprising a reference generator, wherein the upper reference voltage and the lower reference voltage are determined by the reference generator based on the total capacitance of the plural display electrode capacitors on the plural pixel cells of the EPD.

14. The EPD driver apparatus of claim 11 further comprising an analog-to- digital converter, wherein the sense output is generated from the sense voltage using the analog-to-digital converter.

15. The EPD driver apparatus of claim 11, wherein:
a VSS level is coupled to the source lines of each of the pixel cells;
a pulse of VGH level is coupled to each of the gate lines, such that the TFTs on each row of the pixel cells are enabled for a pre-determined duration.

16. The EPD driver apparatus of claim 15, wherein the TFTs on each row of the pixel cells are enabled in a sequential and interleaving manner by generating plural pulses of VGH level for the gate lines, wherein each pulse is not overlapped with other pulses.

17. The EPD driver apparatus of claim 11, wherein:
a VSS level is coupled to the source lines of each of the pixel cells;
a VGH level is coupled to the gate lines of each of the pixel cells, such that all the TFTs are enabled when determining the condition of the EPD.

* * * * *